United States Patent [19]
Lim et al.

[11] Patent Number: 5,572,140
[45] Date of Patent: Nov. 5, 1996

[54] REUSABLE CARRIER FOR BURN-IN/TESTING ON NON PACKAGED DIE

[75] Inventors: Samuel S. S. Lim; Siew K. Tan, both of Tiong Bahru, Singapore

[73] Assignee: Sunright Limited, Tiong Bahru, Singapore

[21] Appl. No.: 147,945

[22] Filed: Nov. 5, 1993

Related U.S. Application Data

[63] Continuation-in-part of Ser. No. 111,706, Aug. 25, 1993.

[51] Int. Cl.$^6$ ................................................ G01R 31/02
[52] U.S. Cl. ............................................ 324/755; 324/765
[58] Field of Search ..................................... 324/72.5, 754, 324/765, 158.1, 755; 174/52.4; 361/751; 29/840, 827; 439/70, 68, 69; 437/8

[56] References Cited

U.S. PATENT DOCUMENTS

| | | | |
|---|---|---|---|
| 4,288,841 | 9/1981 | Gogal | 361/414 |
| 4,480,288 | 10/1984 | Gazdik et al. | 29/846 |
| 4,681,654 | 7/1987 | Clementi et al. | 29/827 |
| 4,750,092 | 6/1988 | Werther | 361/400 |
| 4,857,671 | 8/1989 | Nakano et al. | 174/68.5 |
| 4,899,107 | 2/1990 | Corbett et al. | 324/758 |
| 5,123,850 | 6/1992 | Elder et al. | 437/69 |
| 5,302,891 | 4/1994 | Wood et al. | 324/765 |
| 5,345,039 | 9/1994 | Yamazaki | 174/52.4 |
| 5,414,372 | 5/1995 | Levy | 324/765 |

OTHER PUBLICATIONS

Capp, Arthur O. "Pure Copper Circuit on Ceramic Substrate Process" *Hybrid Circuit Technology*, Nov. 1990.

*Primary Examiner*—Vinh P. Nguyen
*Attorney, Agent, or Firm*—Morgan & Finnegan, L.L.P.

[57] ABSTRACT

A re-usable carrier having a cavity for receiving unpackaged die with molded metallized probe heads to establish contact with the bond pads of the die, enabling the die to be functionally tested through the existing test systems. The novel carrier has metallized contacts for making electrical connection between the bare die and the perimeter of the carrier. The circuitry for electrically connecting the die and the perimeter of the carrier can be molded and plated into the base or printed on polymeric film. The base or integrated cover-base of the carrier may be from injection or press molded thermoplastic or press molded from ceramic to conform to any intended package for the die. The object is to adapt the carrier to the existing test equipment for burn-in stress and electrical tests for the intended package design without having to modify the hardware. The carrier may be plugged into a burn-in socket for burn-in stress testing and inserted onto an automatic test handler for electrical testing. Following burn-in stress and electrical tests, the die is removed and the carrier may be re-used.

9 Claims, 12 Drawing Sheets

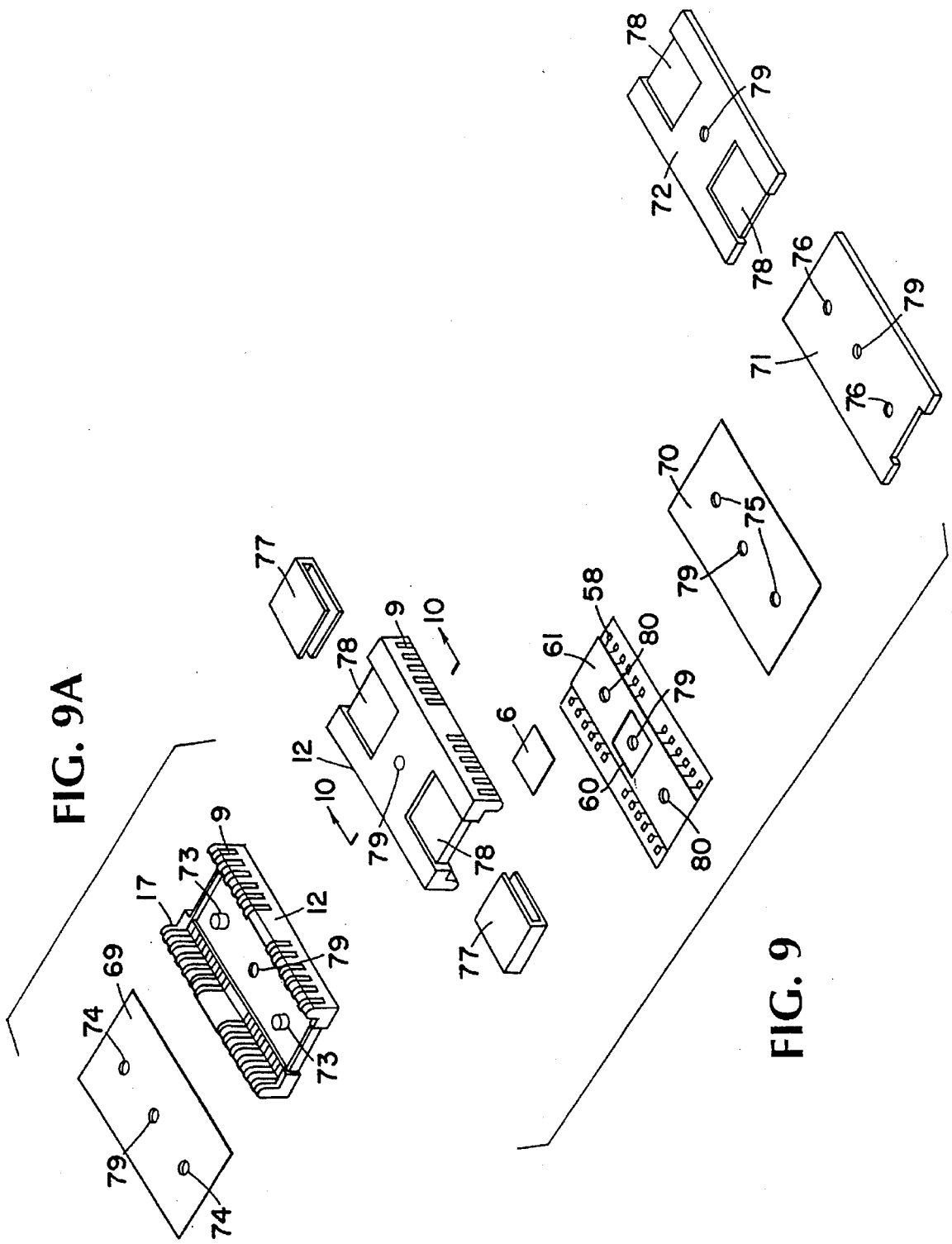

REUSABLE CARRIER FOR BURN-IN/TESTING ON NON PACKAGED DIE

CROSS REFERENCE TO RELATED APPLICATION

This is a continuation-in-part application of pending application Ser. No. 08/111,706, filed Aug. 25, 1993.

BACKGROUND OF THE INVENTION

1. Field of the Invention

This invention relates to a carrier being provided with molded and plated or printed circuits for functional AC, DC as well as burn-in testing of bare or non-packaged circuit chips or die, i.e., non-packaged silicon die with circuitry. The carrier comprises a base with a cover or an integrated cover-base with a film construct.

The novel carrier has metallized contacts for making electrical connection between the bare die and the perimeter of the carrier The circuitry for electrically connecting the die and the perimeter of the carrier can be molded and plated into the base or printed on polymeric film. The base or integrated cover-base of the carrier may be thermal molded or press molded from plastic or ceramic to conform to any intended package for the die, such as plastic Quad Flat Package (QFP), Leadless Chip Carrier (LCC), Small Outline "J" lead, Pin Grid Array (PGA) or any other intended package design. The object is to adapt the carrier to the existing test equipment for burn-in stress and electrical tests for the intended package design without having to modify the hardware, such as: the burn-in sockets, the circuit boards or the automatic test handler.

2. Description of the Related Prior Art

There is an increasing demand for new electronic products which are smaller and lighter. As a result, there is an emerging demand for bare die that are completely electrical and burn-in tested. For example, smart cards are now as slim as the standard credit cards. The multichip module manufacturers design circuits stipulating several different types of chips having different functions to make a hybrid package. The smart card manufacturers and the makers of multichip hybrids require bare die instead of packaged die.

Users of bare die expect die suppliers to meet the stringent quality and integrity of packaged die. Thus, to ensure the quality, yield and reliability of bare die, semi-conductor or die suppliers are required by users to exercise the die by "burn-in" at elevated temperatures to reduce initial failure rate and to conduct final electrical testing to select the good die from the bad die.

The existing method of selecting functioning good die from bad die involves the use of a wafer probe. In wafer probing, electrical signals are sent to a test fixture containing several spring probe needles typically made of tungsten. Each probe is correspondingly aligned to each die pad and each die is individually tested on a wafer before cutting. Ideally, it would be desirable to have the testing of the uncut die on a wafer done at elevated temperatures. However, the thermal expansion of the spring probe needles of the probe tends to cause scrubbing and tearing of the bond pads on the die and cracking of its external protective coating. Therefore, burn-in testing using a wafer probe is limited in the temperature ranges that can be applied.

Some prior art approaches in mounting bare circuit chips on a module or carrier for burn-in or electric testing are described in U.S. Pat. No. 4,899,107: "Discrete Die Burn-In For Nonpackaged Die" and U.S. Pat. No. 5,123,850: Non-Destructive Burn-In Test Socket For U.S. Pat. No. 4,899,109 discloses a reusable burn-in/test fixture for discrete TAB die. The fixture comprises two parts: a die cavity plate to receive die as units under test and a probe plate where each probe is connected to electrical traces which terminate in fingers to accept a conventional card edge connector. The probes tips are metallic needles and protrude from the probe plate to contact the die pads. Thus, it suffers from the same problem as wafer probing. At high temperatures, due to thermal expansion the probe tips still cause scrubbing and tearing of the die pads, particularly when low contact resistance is maintained.

U.S. Pat. No. 5,123,850 describes a burn-in test socket for integrated circuit die. The socket comprises three parts, a metal base with a flexible film probe head, a pin grid array package attached to the probe head and a clamp to hold the device in place. The socket is suitable for testing a plurality of die, a wafer or hybrid packaged die. The flexible film probe head is formed from film coated aluminum, from which aluminum is partially removed by etching. The pads and traces are provided by electroplating. A clear elastomer is poured into the back of the film and cured. Thus, the film probe head is very complicated and is produced by a very complicated process. Moreover, the members of the socket must be aligned properly for it to function.

SUMMARY OF THE INVENTION

The carrier of the present invention overcomes these problems of the prior art non-packaged die carriers for burn-in or electrical testing by providing safeguards for the protection of the bond pads of the bare die against such scrubbing or tearing. One of the safeguards includes providing a flexible molded and metallized probe head in the carrier for contacting the bond pads. Such a probe head is less subject to thermal expansion. Alternatively, the carrier circuit provided as a printed circuit on a film construct which also is less subject to thermal expansion. Thus, scrubbing or tearing of the bond pads of the die are avoided. Further, according to the present invention, testing can be performed on each single cut-out die instead of a wafer of uncut die and the problem of cracking of the external protective coating is reduced. In principle, the carrier of this invention for testing a die comprises a thermal molded or press molded base and a cover or a thermal molded or press molded integrated cover-base with a film construct. The cover for the molded base may also be provided with a heat sink to allow heat dissipation from the die.

The base or the film construct is provided with a well to hold the die and circuitry molded and plated into the base or printed onto the film construct. The base or integrated cover-base of the carrier may be entirely injection or press molded from thermoplastic or press molded from ceramic. Thermoplastics suitable for this purpose are those that can withstand the high temperatures typical of burn-in testing, about 125° C. These include VALOX®, ULTEMP®, RADEL®, etc. from well-known manufacturers. The base is provided with a cavity or well or the integrated cover-base together with the film construct provides a cavity or well to allow a pick and place machine to drop the die into the well with the circuit pattern facing downward. The base or integrated cover-base of the carrier is provided with an indicator to assist the machine in orientating the die. Circuitry is provided to connect the bond pads of the die to the external perimeter of the carrier for electrical testing. In the embodiment using a molded base, a three dimensional circuit pattern is laid out on the molded base in metallized recessed grooves, curves or vertical walls of the molded base by utilizing the PSP™, Mold-n-Plate™, and Mask-n-Add™ processes which are part of Kollmorgen Corporation's patented KOLMOLD™ interconnection system. See Canadian Patent Nos. 1,255,810 and 1,284,862 each of which is incorporated herein by reference. In the embodiment using a film construct, the circuit may be photoprinted on film by well known processes, and connections to the perimeter of the carrier provided by using the PSP™, Mold-n-Plate™, Mask-n-Mold™ processes of the KOLMOLD™ interconnection system described in the Canadian Patents listed above. In the embodiment where the carrier is made of press molded ceramic the required circuitry may be provided by a Q-Clad® or Q-strates® process described in Alfred O. Capp, *Hybrid Circuit Technology*, November 1990, Lake Publishing, Lebertyville, Ill. The pattern of the circuit is designed to electrically connect the probe heads or contact pads, which are in contact with the bond pads of the die, to the perimeter of the carrier for burn-in or electrical testing. The bottom of the base may be provided with a plate permanently sealing the cavity or well to prevent the entry of foreign particles into the die. Whereas, the integrated cover-base acts a seal for the cavity or well.

The molded base or integrated cover-base can be shaped to conform to any package type. Thus, the carrier of the present invention may be directly plugged into a burn-in socket or inserted onto an automatic test handler.

In a preferred embodiment of the present invention, the cover is a spring catch to assemble a separate heat sink with the carrier. In a more preferred embodiment, the integrated cover-base of the carrier may also act as a heat sink. When the cover is mounted onto the molded base, or when the film construct is placed on the integrated cover-base, circuits laid between the metallized probe heads of the thermoplastic injection molded base or contact pads of the film construct to the perimeter of the molded integrated cover-base to carry the electrical signals between the bond pads of the die to the perimeter of the carrier. Each probe head of the base or contact pads of the film construct is designed to align with a bond pad wherever located in the die. For example, in the carrier with a mold base, the probe heads may be placed to align with the bond pads located in the middle of the die. Each of the probe heads is cantilevered to ensure that there is a sufficient biasing force to make a tight contact with each bond pad of the die. The probe heads may be designed to be as close as 4 mils apart from each other. The metallized tips of the probe head may be gold plated to ensure good reliable contact with the bond pads. In the film construct with an integrated cover-base, the circuit and contact pads may be photoprinted onto the film. The contact pads may be placed very closely together, as low as 2 mils apart, and gold plated to ensure good reliable contact with the bond pads of the die. Following burn-in and electrical testing, the die is removed by an automatic pick and place machine. The fully burned-in and tested good die is then ready for application.

One of the novel features of the present invention is that the base or the integrated cover-base of the carrier could be shaped to conform to any type of intended packaging of the die. In the drawings, carriers are shown for a Small Outline "J" lead (SOJ), a Leadless Chip Carrier (LCC) and a Pin Grid Array (PGA) package. The carrier which is designed to conform to an intended package design can be plugged into a conventional burn-in socket for environmental stress testing followed by electrical testing on an automatic handler as desired.

According to one aspect of the present invention, there is provided a re-usable carrier for mounting a non-packaged die for testing comprising: (a) a molded base with a cover or a film construct with an integrated cover-base containing a cavity or well for receiving the non-packaged die; and (b) a circuit on the molded base or in the film construct electrically connecting the bond pads of the non-packaged die to the external perimeter of the base. The base is provided with a cover or the cover integrated with the base as an integrated cover-base for holding the non-packaged die in place in a cavity or well while maintaining connection between the bond pads of the non-packaged die and the external perimeter of the base via the circuit provided. The circuit may comprise a three dimensional circuit in the molded base with metallized recessed grooves and/or protruding metallized lines, a circuit laid out on a ceramic base with metallized traces and/or protruding contacts or the circuit may be photoprinted on the film construct.

The film construct provides a further advantage in that it provides more flexibility. In this embodiment a die can be mated with a cover-base which corresponds with any package design for testing, and the circuitry to connect the die and the test equipment can simply be photoprinted on film without using the more complicated mold and plate processes.

Other objects and advantages, which will become apparent, reside in the detailed construction of the carrier which is more fully hereinafter described and claimed, with reference to the accompanying drawings.

BRIEF DESCRIPTION OF THE DRAWINGS

FIG. 9 shows an exploded view of a SOJ package type using a single sided film construct with its component parts;

FIG. 9A shows the details of the reverse side of the molded cover base;

DETAILED DESCRIPTION OF THE EMBODIMENTS OF THE INVENTION

Figure 1:
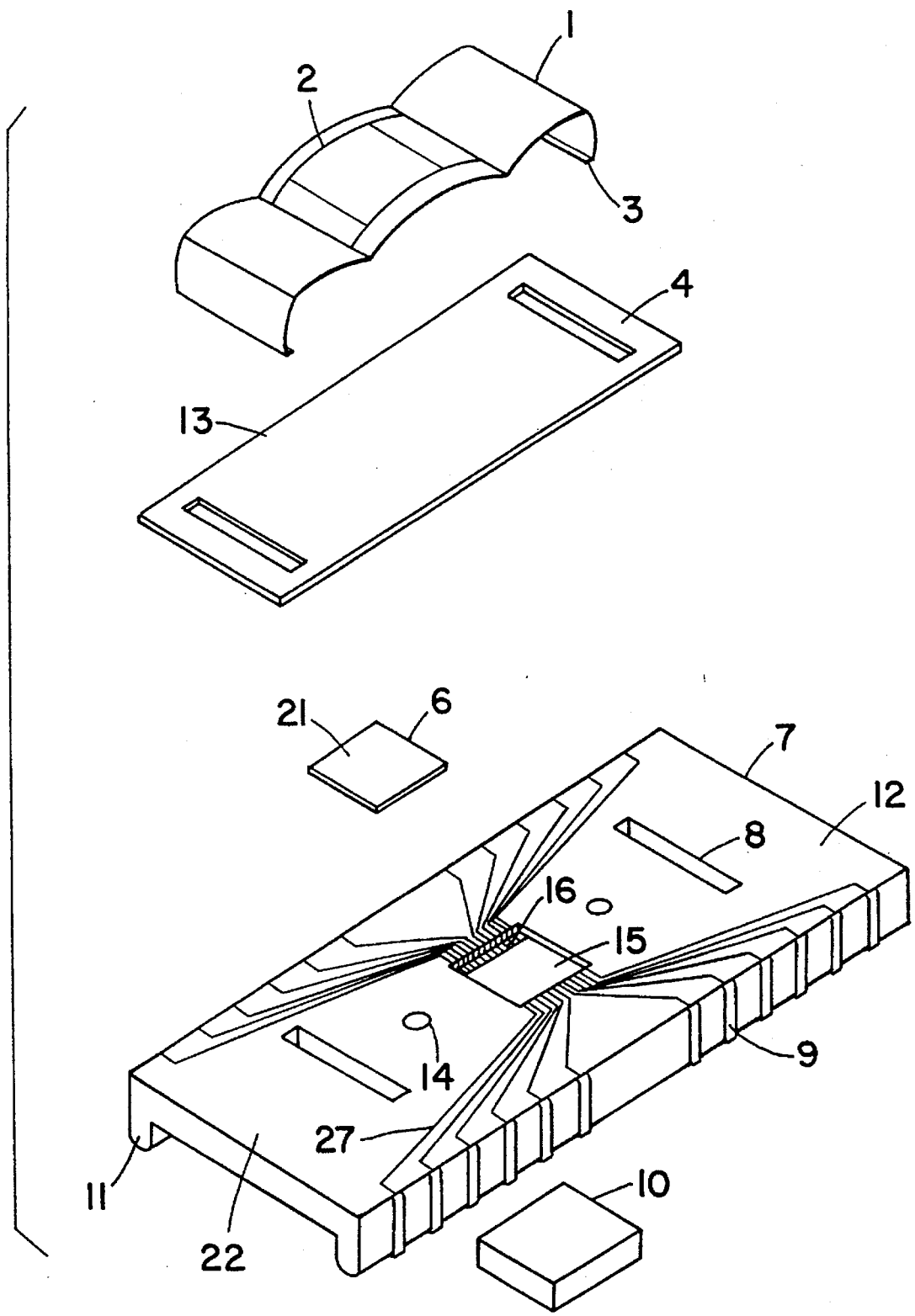
FIG. 1 is an exploded view of a preferred embodiment of the invention.

Referring now to FIG. 1, which shows one embodiment of the present invention, there is illustrated a injection molded thermoplastic base with a well 15 in which die 6 is placed and held. An indicator ensures the correct orientation for the loading of the die. The recessed circuit 27 converges at well 15. In well 15, cantilevered probe heads shaped like pyramids are positioned to align with the bond pads of the die. Bottom plate 10 provides a permanent cover to prevent entry of foreign particles to contaminate the die. In FIG. 1, the cover 1 is a spring catch and holds the assembly together with catch 3. Location holes 14 help locate heat sink 13 which also acts as a pressure distribution plate. Two studs 28 (shown in FIG. 2) are provided on the under side of heat sink 13. The ends of the catch 3 penetrates apertures 4 in the heat sink and slots 8 in the thermoplastic molded base to hold the assembly together. In this embodiment, the base may also be press molded from ceramic with the circuit laid in grooves, protruding on the surface of the base or even with the surface of the base.

Figure 1B:
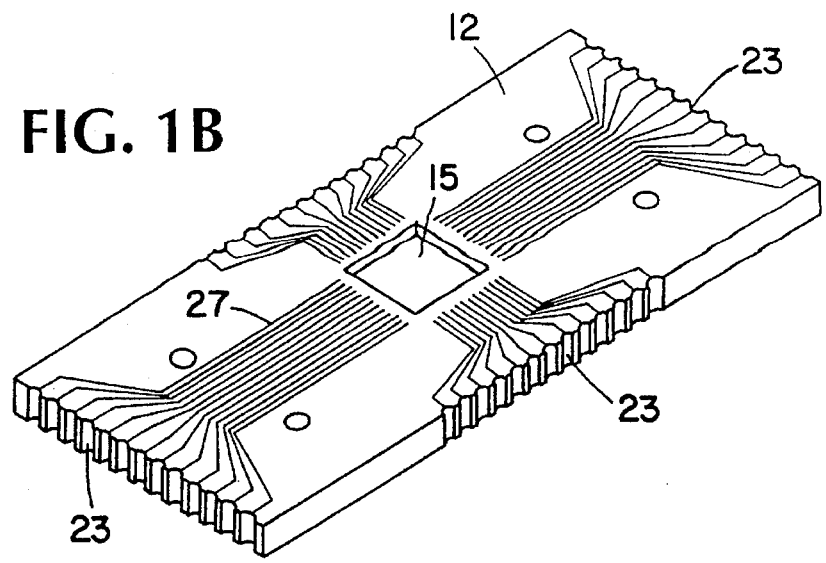
FIG. 1B illustrates the base in LCC package type.
Figure 1C:
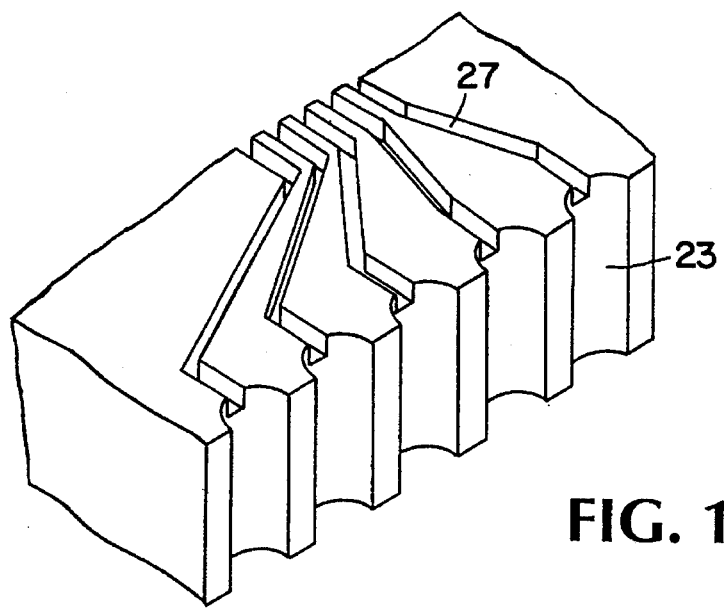
FIG. 1C shows an enlarged view of the LCC contact lead area.
Figure 1A:
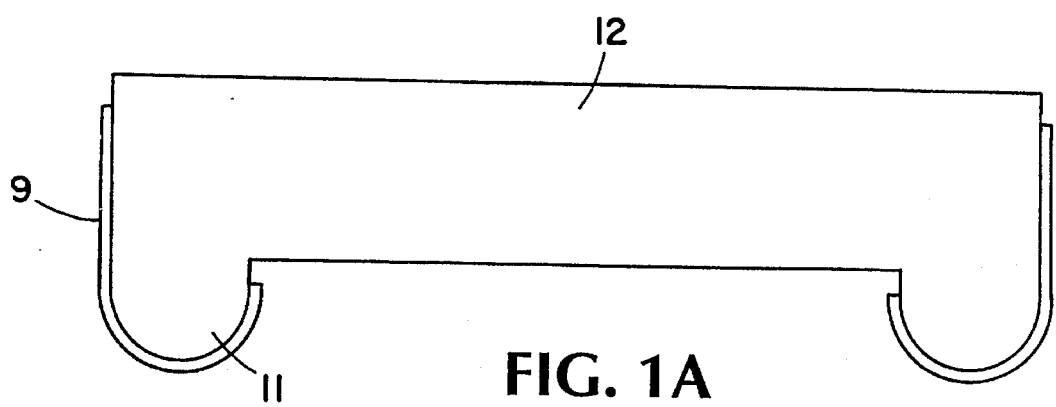
FIG. 1A shows an end view of a molded base in SOJ package type.

The metallized circuitry may be recessed on surface 27 and reversed to protrude at the edge of the molded base 11. The protruding metallized circuitry 9 is formed on the surface of the molded base as illustrated in FIG. 1A for a SOJ package. In FIG. 1B, the connecting circuit is provided in the recessed grooves 27 which fan out to the four edges of the molded base to continue in recessed grooves which are semicircular in shape like that of an LCC package. The semi-circular grooves 23 shown in FIG. 1C are suitable for use for electrical testing of the die for an LCC package.

Figure 2:
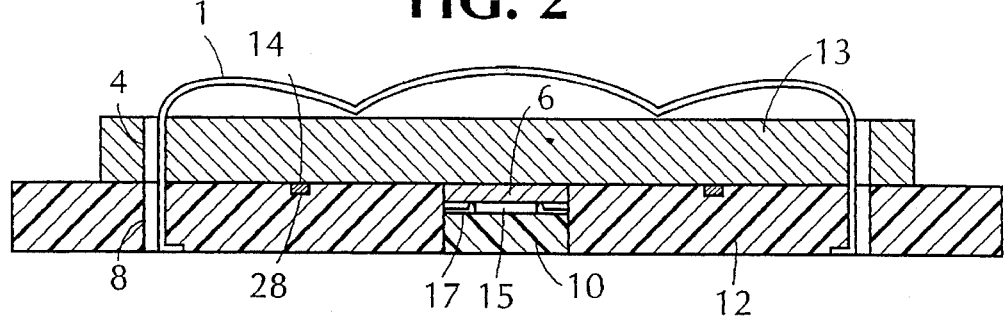
FIG. 2 shows a cross-sectional view of the assembled carrier of the preferred embodiment and the die.
Figure 3:
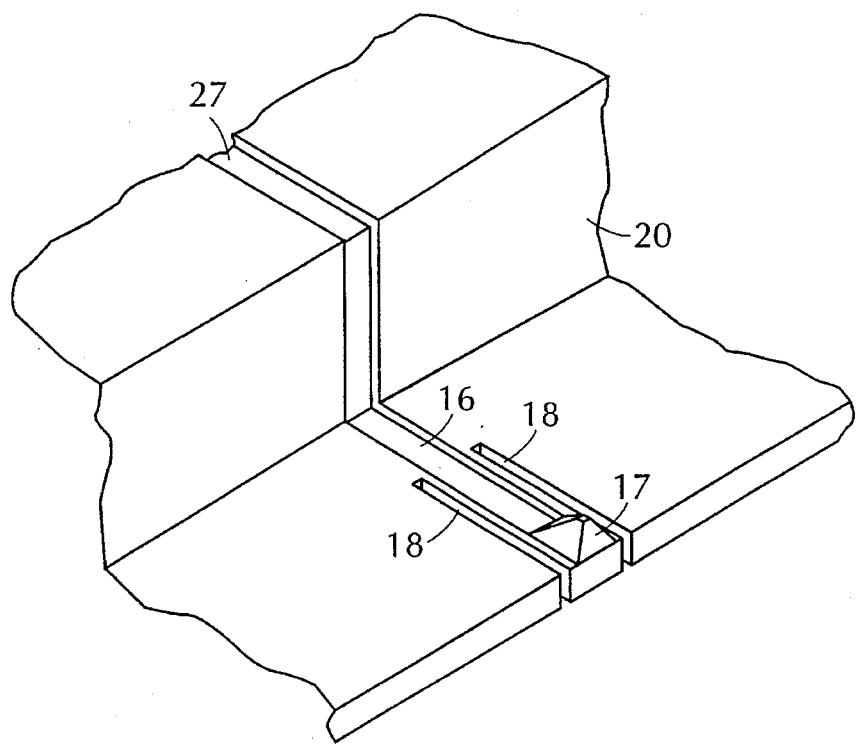
FIG. 3 is a prospective view showing the details of a single probe head in the cavity or well of the molded base.

FIG. 2 shows a cross-sectional view of an assembled carrier with the die 6 in the well 15. The die is seated so that the bond pads are aligned with the probe heads 17, a close-up view of which is shown in FIG. 3. Metallized groove 16 is recessed in molded base 12. Bottom plate cover 10 seals the well permanently.

FIG. 3, illustrates a cantilevered probe head 17 having a protruding pyramid shaped head to provide more effective contact with each bond pad of the die. The cantilever action is achieved with slits 18 which provide proper biasing force and avoid possible co-planarity with the bond pads on the die. The probe, which is in metallized groove 16, is positioned lower than the surface of the thermoplastic injection molded base so that the die surface is prevented from making contact with the surface of the thermoplastic injection molded base. This is especially so at wall 20 of die well 15. Here, only the plated protruding pyramid heads make contact with the bond pads on the die. In this embodiment, it is preferable that the base is made of thermoplastic. Because the base is molded from thermoplastic or ceramic and the film is made from polymeric materials, there is less thermal expansion at high temperatures. Moreover, only the probe tips of the probe head or the contact pads of the film construct are in contact with the bond pads of the die, scrubbing and tearing of the bond pads are avoided. Also, because the cover holds a heat sink or the integrated cover-base acts as a heat sink and each die is tested singly, the temperature is more evenly distributed on the die and cracking of the external protective coating on the die is reduced.

Figure 4:
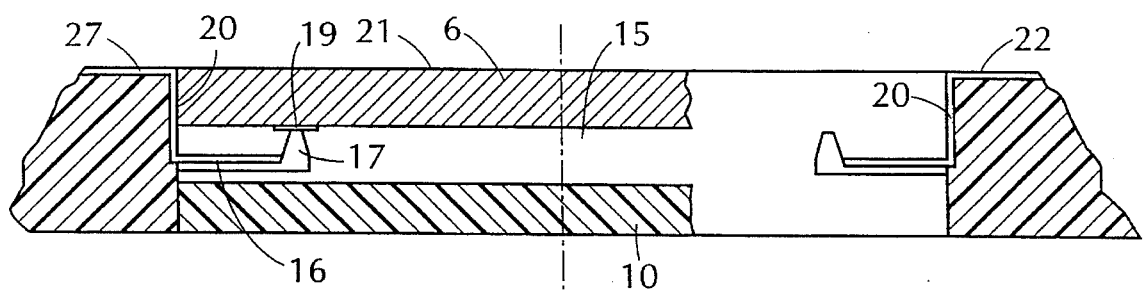
FIG. 4 is a cross-sectional view of the die well and the die bond pads in contact with the probe head.

FIG. 4 is a cross-sectional view of the die well 15 and a die 6 with bond pads 19 in contact with the protruding pyramidal probe heads 17. The die surface 21 protrudes slightly above the upper surface when spring catch 1 is mounted on the assembly. This provides a clamping pressure which is transmitted to the cantilevered probe heads.

Figure 5A:
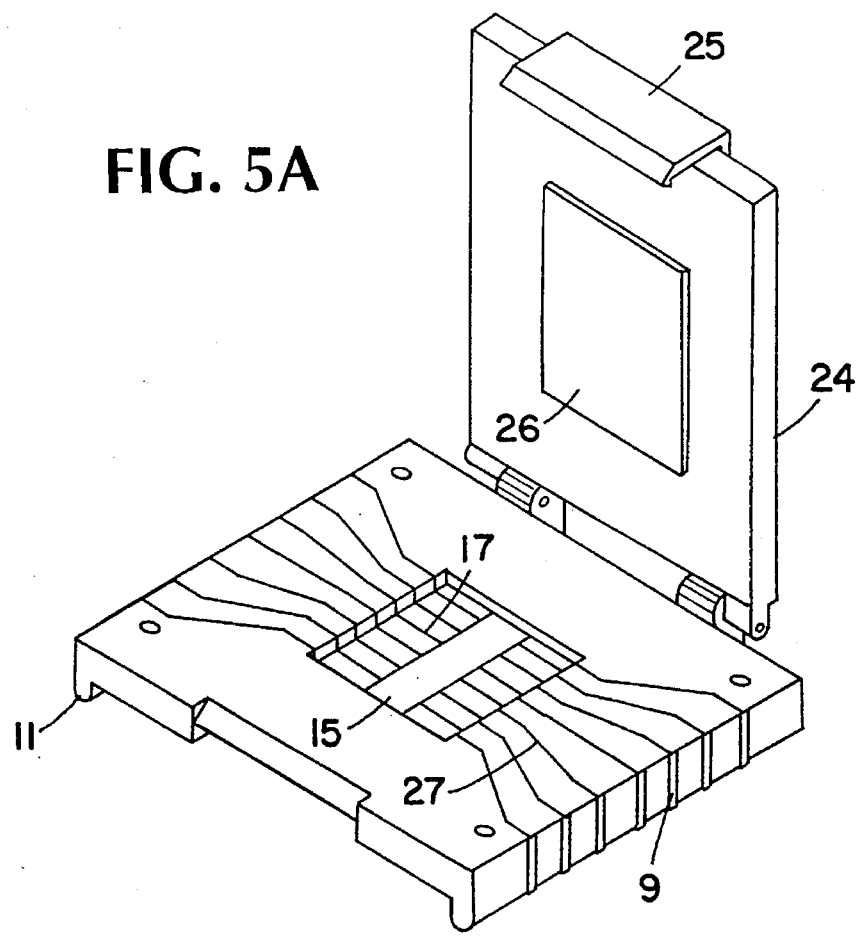
FIGS. 5A and 5B illustrate another embodiment of the cover wherein a hinge is used in place of a spring catch.
Figure 5B:
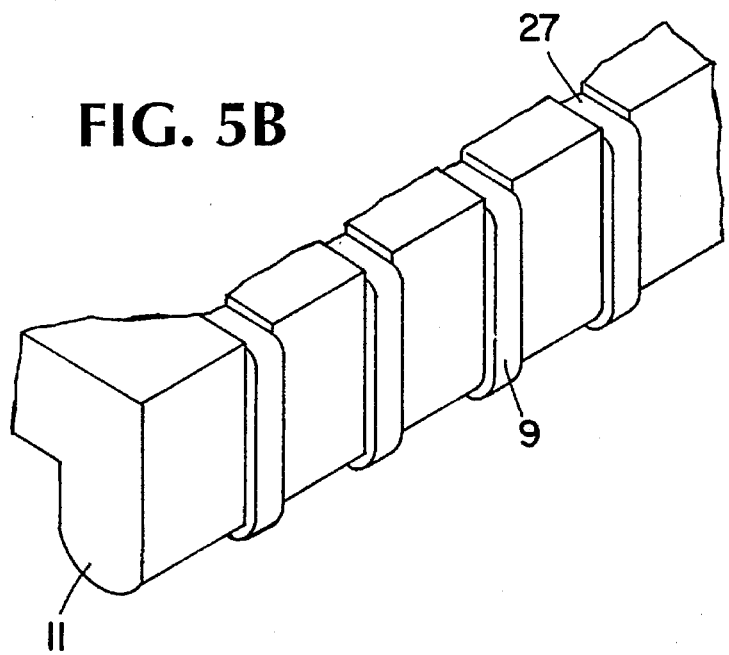
Figure 6A:
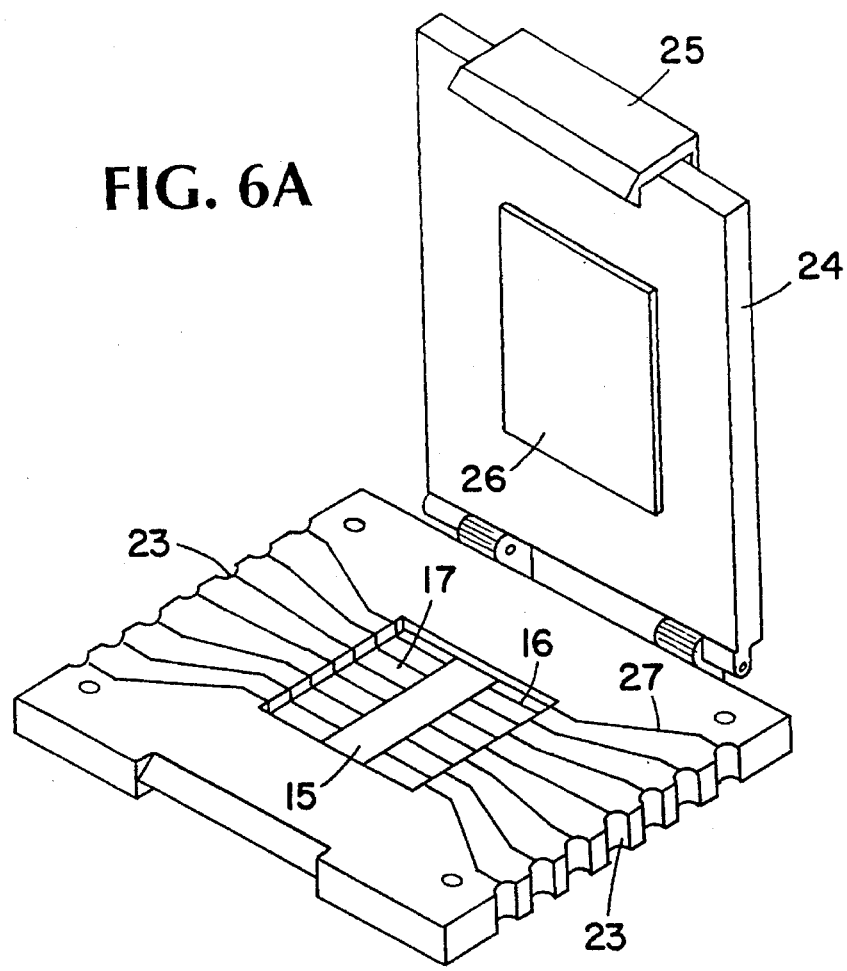
FIGS. 6A and 6B show a molded base in LCC package type using a hinged cover.
Figure 6B:
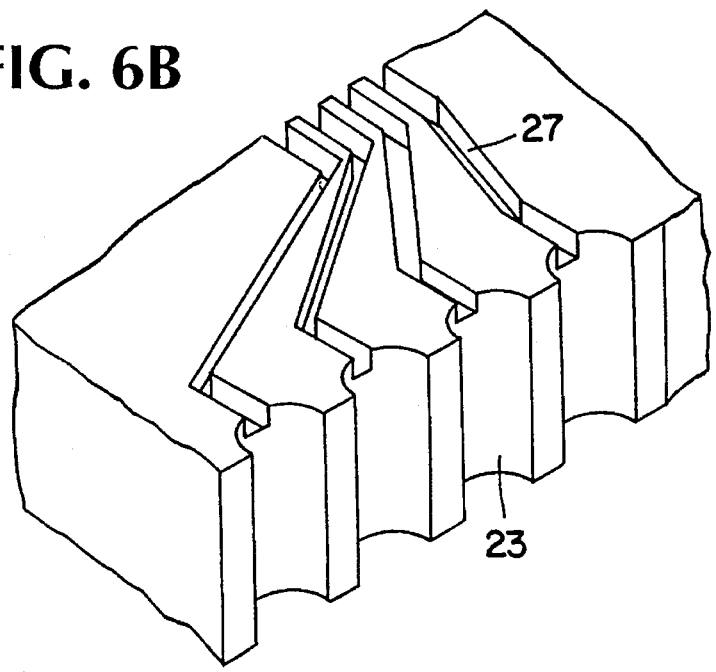

FIGS. 5A and 5B illustrate another embodiment using a hinged cover 24 to replace the spring catch cover of FIG. 1. Here, the hinged cover also acts as a heat sink, and spring clamp 25 is used to apply and distribute the pressure evenly over the die. This embodiment allows easy access for loading and unloading the die. In this illustration, the base is molded to conform with the SOJ package shape, and provided with metallized circuitry 9 along edge 11, protruding therefrom for electrical testing. The probe head 17 is positioned in this illustration to be near the centerline of the die well 15. This arrangement caters to those dies with bond pads arranged along the middle of the die. FIGS. 6A and 6B show a carrier with an LCC designed base with semicircular grooves 23 along the edges and circuitry for electrical testing.

Figure 7A:
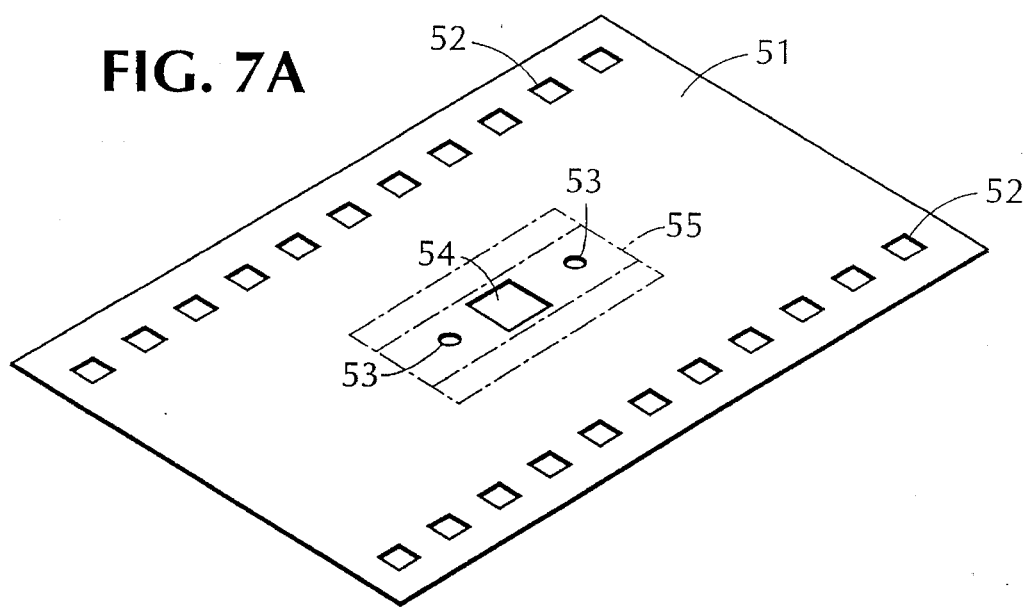
FIGS. 7A, 7B and 7C show the construction of a single sided printed film construct.
Figure 7B:
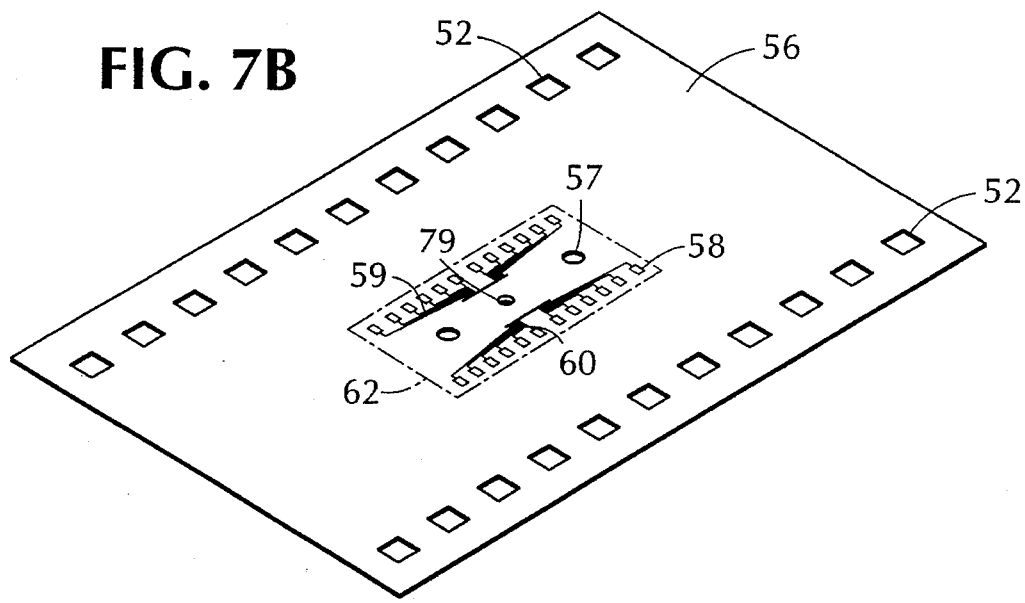
Figure 7C:
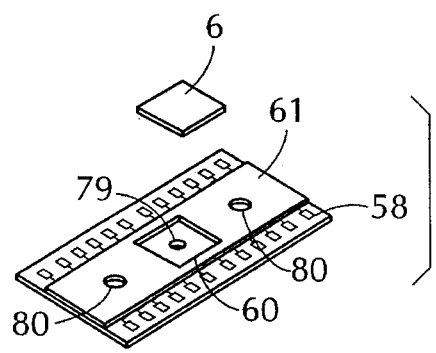
Figure 8A:
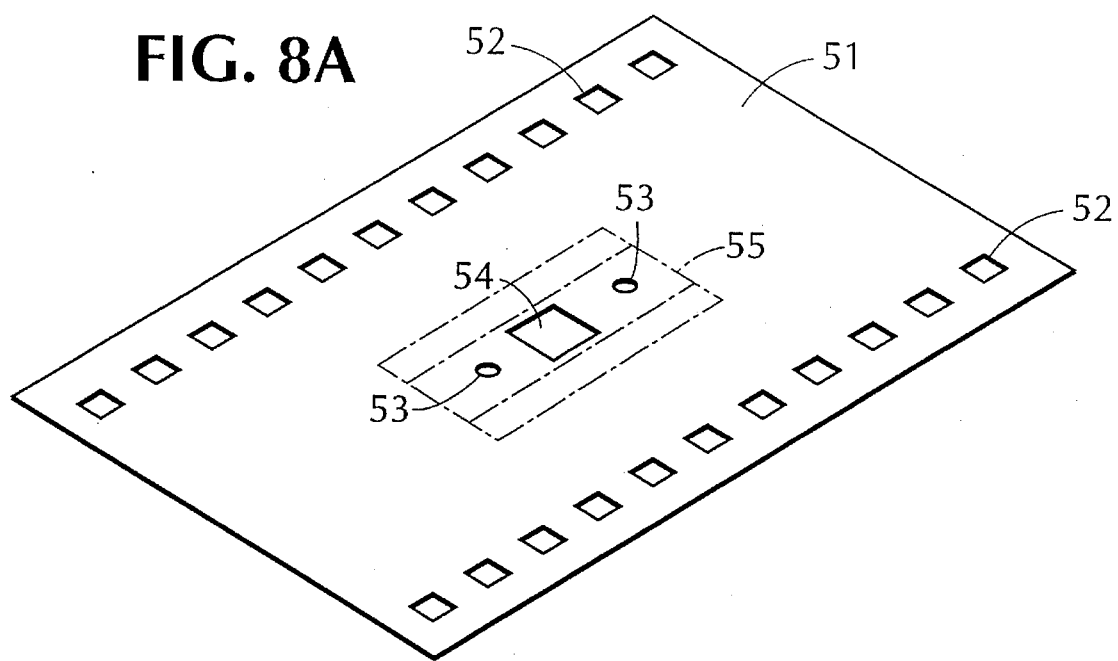
FIGS. 8A to 8E show the construction of a double sided printed film construct.
Figure 8B:
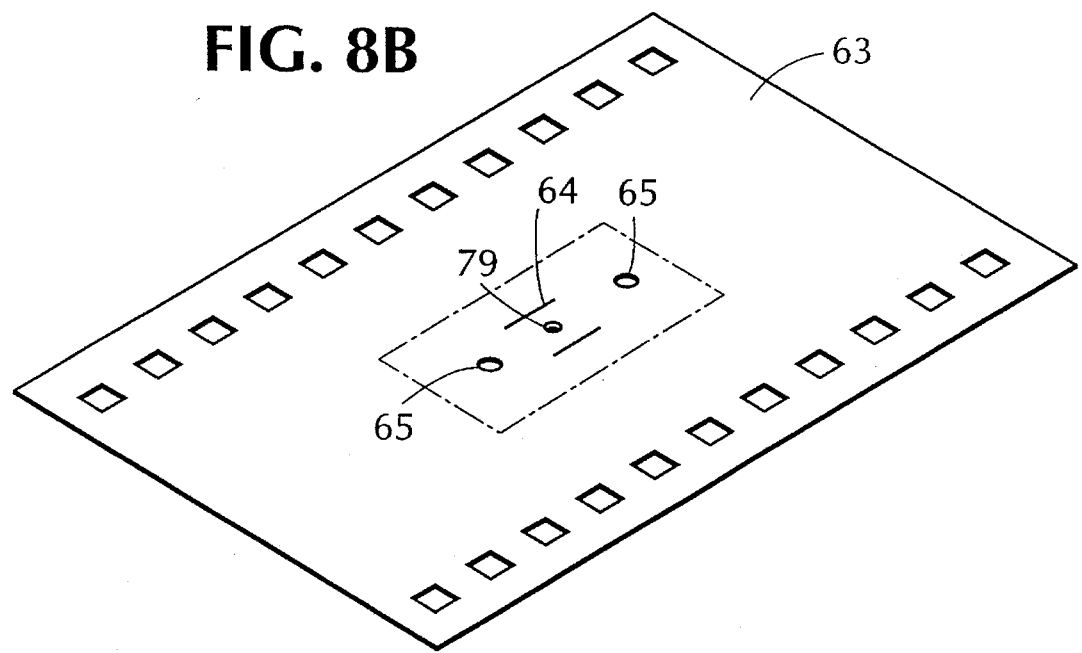
Figure 8C:
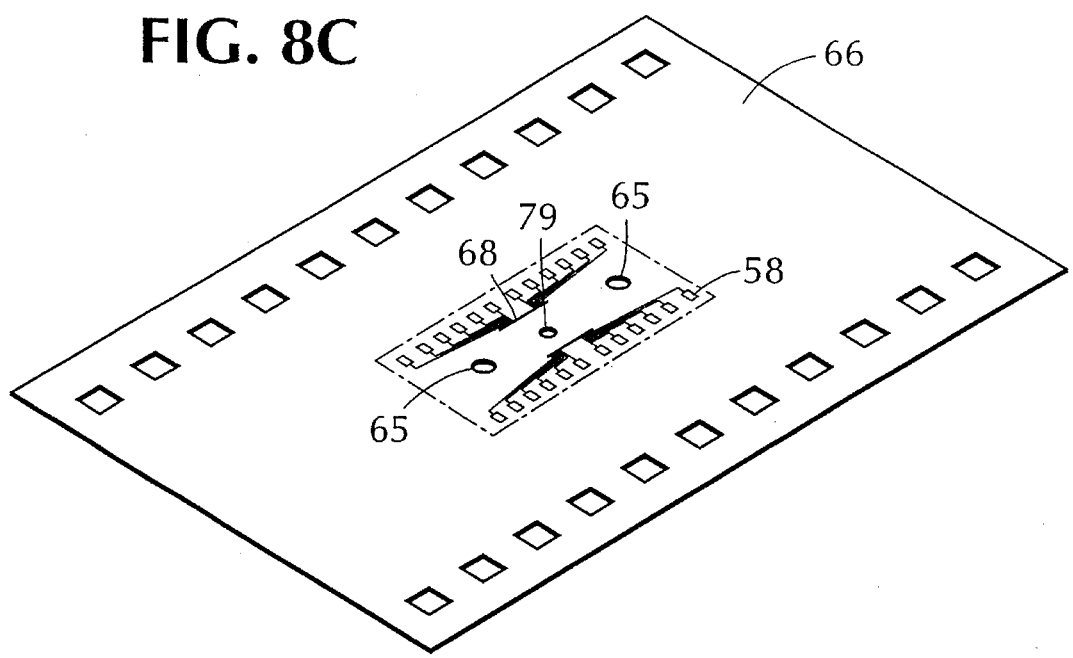
Figure 8D:
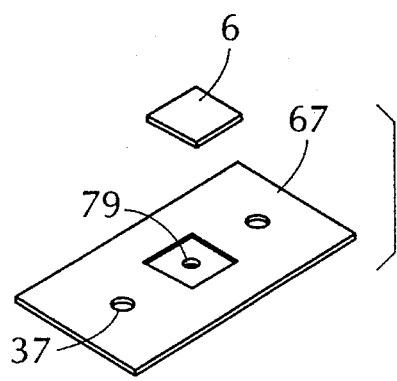
Figure 8E:
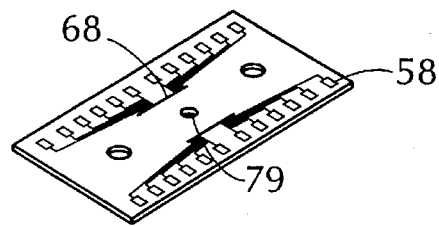

FIGS. 7A, 7B and 7C show a single sided film construct before and after assembly into the carrier. The film construct is made from 35 mm polyamide film or an equivalent manufactured by 3M, Du Pont or Sumitomo. FIG. 7A shows a die well film of the carrier constructed from film with a pre-cut die well. There are two alignment holes 53 for aligning the entire carrier assembly 61. The thickness of the film corresponds with the die which is designed to sit in the film well.

FIG. 7B shows a single sided film 56 with a printed circuit pattern 59 thereon. The printed circuit is provided with a mask of appropriate thickness so that only contact pads 60 to the bond pads of the die and the contact's pads 58 to the contacts on the molded cover-base are exposed. There are two alignment holes 57 for assembling the film construct to the cover-base. Connections with bond pads are provided by printed fanned out traces 59 to the cover-base contacts 58. Pre-cut lines 62 show the border of the film construct 61. The contact pads 58 and 60 are electroplated with gold making a bump on each contact pad, the tips of the bumps being above the mask layer thickness. FIG. 7C shows the assembly of the film construct 61. Die well film 51 and film 56 are ultrasonically welded together. Registration of the two film layers is important and is achieved using the sprockets on the sides of the film before the film construct assembly 61 is cut out.

FIG. 8 shows a double sided film construct at its component level. It is basically the same as the single sided film construct except the "through hole" process is used here to connect a printed circuit on one side of the film to the printed and electroplated contact pads on the other side of the film. FIG. 8A is similar FIG. 7A. FIG. 8B shows side of the film with contacts to the bond pads. Contact bumps on the through hole 64 are aligned with the bond pads on the die 6. Through holes 64 are made by laser and are plated through. Bumps are formed on the plated through holes 64 to provide contacts to the bond pads of the die. FIG. 8C shows the opposite face of the film. Traces are laid to fan out from the bond pad contact pads 64 to the cover-base contact pads 58 which are provided with higher pitch. FIG. 8D shows the orientation of the film construct with the circuit side facing down. FIG. 8E shows the details of the film construct with the circuit side up, the reverse side of FIG. 8D.

FIG. 9 is an exploded view of the assembly for a single sided film construct with a molded cover-base, molded to conform to the intended packaging for the die. Two metal clips 77 hold the assembly together and provide contact pressure. Clips 77 and slots 78 are flushed to enable a SOJ type molded cover-base to be used on an existing test socket or machine. Positioning and alignment of all parts are made by mating holes 74, 75, 76 and 80 on the various components with studs 73 of the carrier base. Die removal is aided by hole 79. FIG. 9A shows the details of the reverse side of the molded cover-base 12. High thermally conductive silicon rubber 69 and 70 are located by mating holes 74 on the silicon rubber to studs 73 on the molded cover-base. Silicon rubber is used because it is soft and elastomeric and can take up slack to even out the contact pressure. A spacer 71 may be used to ensure even contact pressure used in conjunction with or in place of silicon rubber 70. Cover means 72 with clips 77 are used to hold the film construct 61, silicon rubber 70 and spacer 71 to the molded base.

Figure 10:
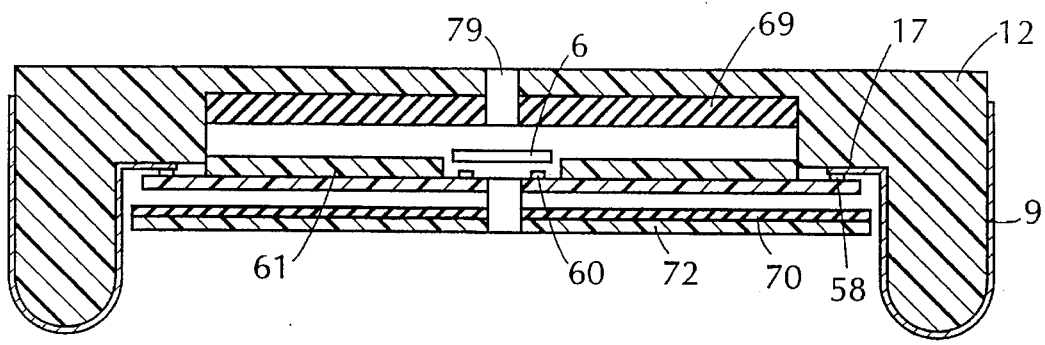
FIG. 10 shows a sectional view of a carrier for an assembled SOJ package.

FIG. 10 shows a cross-sectional view of the assembled cover-base in FIG. 9 through section B—B. Die 6 is sandwiched between thermally conductive rubber layers 69 and 70. Flexible silicon rubber is used to distribute the contact pressure when clips 77 are applied. Die removal is aided by hole 79. Electrical connection between the bonds pads on the die 6 to the perimeter of the cover-base is through contact pads 60 connected through the printed traces to contact pads 58 on the film and 17 on the integrated cover-base. The shaded portions show protruding traces 9 and the manner in which electrical connection to the test equipment can be achieved.

Figure 11:
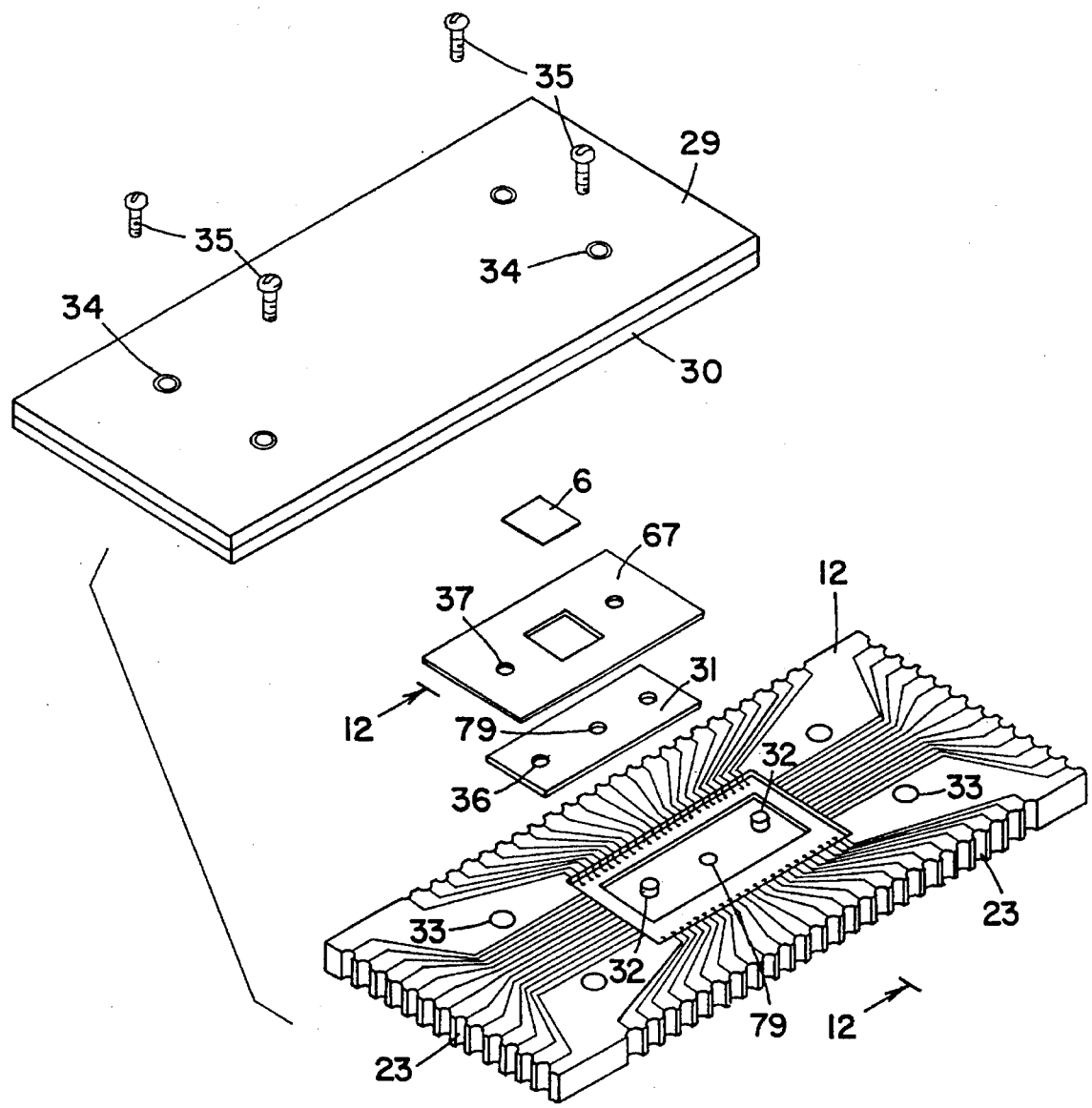
FIG. 11 is an exploded view of a carrier for a LCC package.

FIG. 11 shows a four sided LCC molded cover-base for a film construct. The double sided film construct for this embodiment has less contact requirement than that of the edges of a LCC package. The careful matching of the bond pads on the die, film contact pads and the contacts on the molded cover-base, allows flexibility and re-use of the molded cover-base carrier without frequent re-tooling. Pressure is evenly exerted by attaching a pressure plate 29 with a layer of highly thermal conductive silicon rubber 30 to the molded cover-base with four screws 35.

Figure 12:
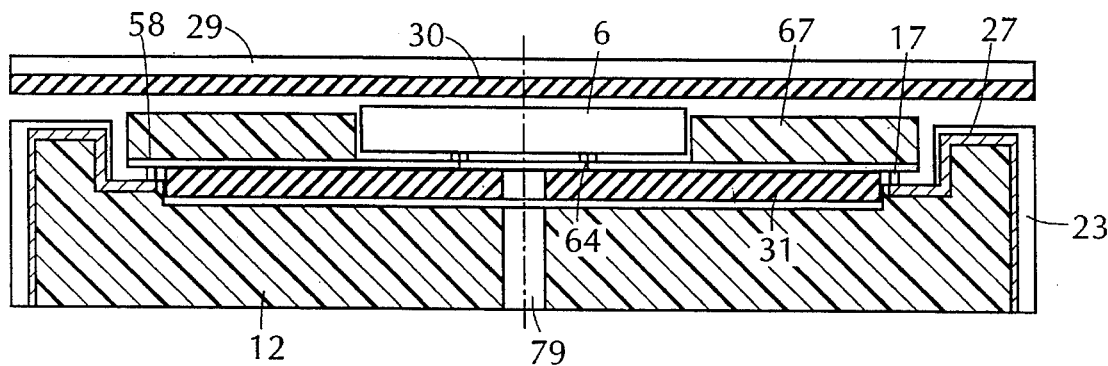
FIG. 12 is a sectional view of a carrier for an assembled plastic Leadless Chip (LCC) package.

FIG. 12 shows a cross-sectional view along the line A—A of an assembled cover-base carrier wherein recessed connection 27 is shaded. Silicon rubber packings 30, 31 are also added to take out slack and provide flexibility.

Figure 13:
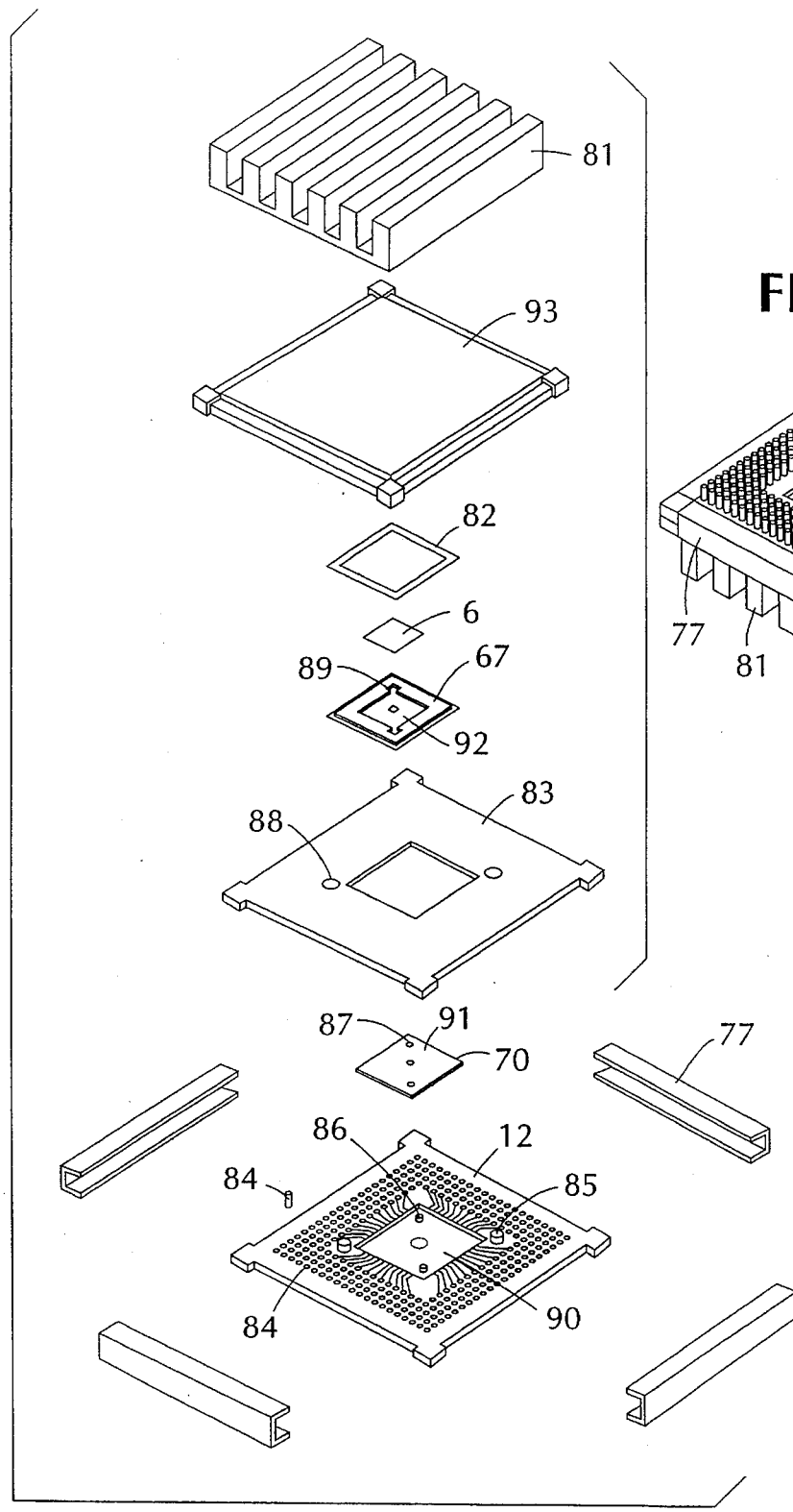
FIG. 13 is an exploded view of a carrier for a PGA package molded from ceramic.

FIG. 13 shows the parts and the assembly for a Pin Grid Array (PGA) package carrier. The molded base 12, cover plate 93 and spacer plate 83 of the carrier can be press molded from ceramic or injection or press molded from plastic. For high temperature applications, ceramic is preferred. The film construct 67 is similar to the film construct of FIG. 8 and comprises two layers of film. The first film layer is a double-sided film construct printed with circuitry to electrically connect the bond pads of die 6 with the pins 84 in the array. The second film layer, the die-well film, is configured to be smaller than the first film layer and is provided with a cutout as a well for holding the die. The pins 84 are soldered and seated in circular blind holes provided in molded base 12. Connection traces are provided on molded base 12 to connect the contact pads on the film construct 67 to the pins 84. The traces may be laid on molded base 12 in grooves, on the surface even therewith, or slightly protruding from the surface of the mold base. The molded base 12 is also provided with studs 85 and 86 for alignment of the assembly and hole 90 to aid die removal and visual checking of the registration of the die.

The carrier is assembled by placing the spacer plate 83 with holes 88 aligned with posts 85. The thickness of spacer plate 83 is such to prevent travel of the cover plate 93 and damage to the die bond pads. Spacer plate 83 may be bonded by using epoxy adhesive or 556 heat bonding film available from 3M Company. to the molded base 12 for ease of assembly or handling. A spacer 70 is inserted into the cutout on spacer plate 83 aligned with studs 86 and hole 91 with hole 90 on the molded base 12.

Figure 13A:
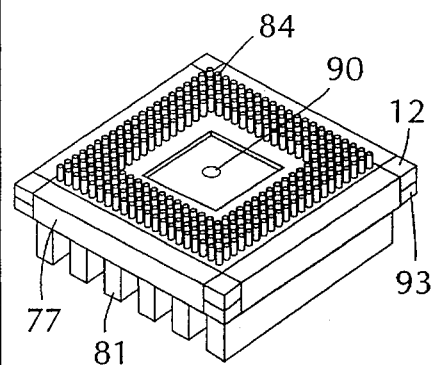
FIG. 13A is a view of the reverse side of the PGA package as assembled.

The film construct 67 is inserted into the cutout on the spacer plate. Die 6 is inserted into the die-well on the film construct. A second spacer 82 is placed cover the die. Then a cover plate 93 is placed over the assembled package. The sides of molded base 12, the spacer plate 83 and cover plate 93 may be trimmed leaving four extending corners. Clips 77 clamps the assembled package on all four sides and may be hinged on the molded base to clip onto cover plate 93. Spacers 70 and 82 are made of highly conductive silicon to take up slack and provide even contact pressure to avoid damage to the die. Heat sink 81 is inserted on top of cover plate 93 to allow easy dissipation of heat during burn-in testing. A view of the reverse side of the fully assembled package is provided in FIG. 13A.

Cover plate 93 may also be provided with circuitry designed to accommodate dies that require a backside potential. The traces are laid on the surface of cover plate 93 for interconnection with the substrate at the backside of the die.

Figure 14:
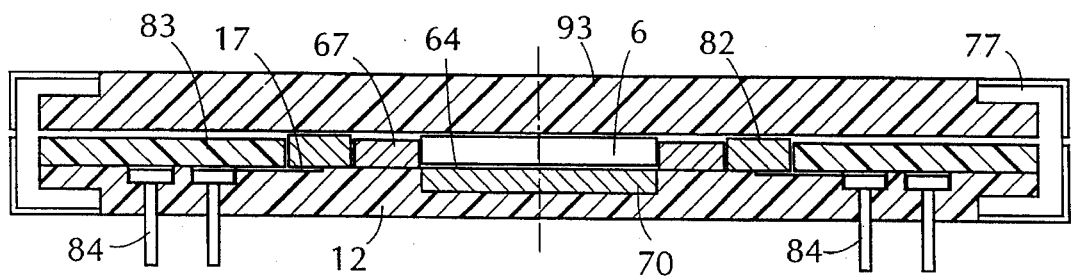
FIG. 14 is a sectional view of a carrier for an assembled PGA package.

In FIG. 14, a sectional view of the assembled package shows in greater detail how the various parts of the PGA package carrier are assembled. It is to be noted that contacts 17, like the probe heads 17 in FIG. 4, connect the contact pads on the die with the pins 84.

The many features and advantages of the invention are apparent from the detailed description of the embodiments. It is intended by the appended claims to cover all of the features and advantages of the carrier assembly which fall within the spirit and scope of the invention. Numerous modifications and changes will readily occur to those skilled in the art, and is not to be limited to the construction and operation shown and described. Accordingly all suitable modifications and equivalents may be resorted to and considered to be falling within the scope of this invention.

What is claimed is:

1. A re-usable carrier for mounting a non-packaged die for burn-in and testing comprising a molded base having a configuration and outer perimeter conforming to a standard integrated circuit package design, said base including integrally formed terminals positioned on the outer perimeter and having a shape conforming to the terminals of the standard integrated circuit package design, a thin layer electrically conductive material coated on the integrally formed terminals of the base to form outer circuitry for enabling electrical contact of the terminals with test equipment, said thin layer electrically conductive material extending along said base adjacent said formed terminals to form electrical contacts on the base, a thin layer film construct received on the molded plastic base, said film construct including means for receiving and positioning a non-packaged die with bond pads, and including a printed circuit positioned on the film and engaging the electrical contacts on the base for enabling electrical connection between the outer circuitry positioned on the formed terminals and the bond pads of a received non-packaged die, a cover removably mounted on the molded base for holding the non-packaged die to the film construct and imparting sufficient pressure for maintaining connection between the bond pads of the non-packaged die and the printed circuit on the film, and cover holding means for detachably holding the cover to the molded base, wherein said cover, molded base, film construct and cover holding means form a carrier having a shape and dimension substantially conforming to a standard integrated circuit package design so as to allow use with existing test equipment.

2. A re-usable carrier according to claim 1 wherein said base includes a recessed portion for receiving said film construct and wherein said electrical contacts of said base are positioned in said recessed portion for engaging the printed circuit on the film construct.

3. A re-usable carrier according to claim 1 wherein said film construct comprises a first film containing a well for receiving a non-packaged die, and a second film bonded to the first film, said second film including said printed circuit.

4. A re-useable carrier according to claim 3, wherein said first film has a thickness corresponding to the thickness of a non-packaged die to be tested.

5. A re-useable carrier according to claim 3 wherein said first film is secured to said second film by ultrasonically induced welds.

6. A re-useable carrier according to claim 3 wherein said printed circuit on said second film includes contact pads for engaging bond pads of a non-packaged die and bond pads for engaging said electrical contacts on the base.

7. A re-useable carrier according to claim 6 wherein said contact pads are positioned on a single side of said second film.

8. A re-useable carrier according to claim 6 wherein said second film has the printed circuit positioned on one side, and the contact pads are positioned on the other side of the film, and including means electrically connecting the bond pads and printed circuit.

9. A re-useable carrier according to claim 8 wherein the means electrically connecting the bond pads and printed circuit comprise a through hole within the film, said through hole including electrically conducting material coated on the sides of the through hole and interconnecting the printed circuit and the bond pads.

* * * * *